US008754703B2

(12) United States Patent
Ogawa

(10) Patent No.: US 8,754,703 B2
(45) Date of Patent: Jun. 17, 2014

(54) INTERNAL VOLTAGE TRIMMING CIRCUIT, METHOD THEREOF AND SEMICONDUCTOR CIRCUIT DEVICE COMPRISING THE SAME

(71) Applicant: Powerchip Technology Corporation, Hsin-Chu (TW)

(72) Inventor: Akira Ogawa, Tokyo (JP)

(73) Assignee: Powerchip Technology Corp., Hsin-Chu (TW)

( * ) Notice: Subject to any disclaimer, the term of this patent is extended or adjusted under 35 U.S.C. 154(b) by 0 days.

(21) Appl. No.: 13/668,866

(22) Filed: Nov. 5, 2012

(65) Prior Publication Data

US 2014/0002179 A1    Jan. 2, 2014

(30) Foreign Application Priority Data

Jul. 2, 2012   (JP) ................................. 2012-148651

(51) Int. Cl.
*G11C 5/14*   (2006.01)

(52) U.S. Cl.
USPC .......................................... 327/530; 327/538

(58) Field of Classification Search
USPC .................. 327/530, 538, 540, 541
See application file for complete search history.

(56) References Cited

U.S. PATENT DOCUMENTS

| 7,250,807 | B1 * | 7/2007 | Doyle | 327/534 |
| 7,440,341 | B2 * | 10/2008 | Lee | 365/189.09 |
| 8,368,457 | B2 * | 2/2013 | Ikenaga | 327/530 |
| 2005/0062507 | A1 * | 3/2005 | Naffziger et al. | 327/105 |
| 2008/0265983 | A1 * | 10/2008 | Barrows et al. | 327/537 |

FOREIGN PATENT DOCUMENTS

| JP | 9285109 | 10/1997 |
| JP | 10232486 | 9/1998 |
| JP | 2001229697 | 8/2001 |
| JP | 2009232486 | 10/2009 |

* cited by examiner

*Primary Examiner* — Quan Tra
(74) *Attorney, Agent, or Firm* — Muncy, Geissler, Olds & Lowe, P.C.

(57) ABSTRACT

TASK: to provide an internal voltage trimming circuit having a simple configuration and operated by a consumption current smaller than that using a comparator. MEANS FOR SOLVING THE PROBLEM: An internal voltage trimming circuit comprises a trimming controller using a change in a counting value of a clock according to a current flowing through a transistor of a power supply current source for a clock generator to trim an internal voltage generated by an internal voltage generator. The trimming controller counts a first counting value of the clock when a predetermined reference voltage is applied to a control terminal of the transistor and a second counting value of the clock when the internal voltage is applied to the control terminal of the transistor and controls the internal voltage generated by the internal voltage generator to substantially coincide the second counting value with the first counting value.

17 Claims, 13 Drawing Sheets

| Voltage VA (V) | 10000 CLK period (ms) |
|---|---|
| 30 | 1 |
| 29.95 | 1.026 |

INTERNAL VOLTAGE TRIMMING CIRCUIT, METHOD THEREOF AND SEMICONDUCTOR CIRCUIT DEVICE COMPRISING THE SAME

CROSS REFERENCE TO RELATED APPLICATIONS

This application claims priority of Japan Patent Application No. 2012-148651, filed on Jul. 2, 2012, the entirety of which is incorporated by reference herein.

BACKGROUND OF THE INVENTION

1. Field of the Invention

The invention relates to a semiconductor device, and more particularly to a trimming circuit and a method for internal voltage of a semiconductor memory device, such as a NAND-type flash memory, etc, and a semiconductor device comprising the trimming circuit.

2. Description of the Related Art

A flash memory includes an internal circuit that generates read-out voltages, write-in voltages and erases voltages. In the conventional method, for obtaining precise voltages, a voltage trimming circuit using a resistor ladder circuit and a comparator are generally used to control and adjust those internal voltages. However, when the voltage trimming circuit is used, in the strict sense, the internal voltages are lower or higher than target values because of the process variations of the comparator and resistors of the voltage trimming circuit. In this case, adjusting the trimming code to obtain precise voltages is needed.

As disclosed in Patent Document 1, FIG. 9 is a circuit diagram showing the configuration of a charge pump circuit 100 used in a flash memory according to the first prior art. The internal configuration and operation of the flash memory having the charge pump circuit 100 will be described later.

The flash memory shown in FIG. 9 comprises the charge pump circuit 100 for generating a boost voltage VP by boosting an external supply voltage VPP and a memory unit 101 driven by the boost voltage VP output from the charge pump circuit 100. Here, the charge pump circuit 100 comprises a pump circuit 110, a potential detecting circuit 111 and an oscillator circuit 112. The potential detecting circuit 111 detects whether the potential of the boost voltage VP reaches a predetermined potential so as to control the boosting operation of the pump circuit 110 to generate the predetermined boost voltage VP.

The pump circuit 110, a so-called Dickson charge pump, comprises a charge transferring means constituted by an NMOS transistor 142 having a drain where the external supply voltage VPP is applied, an NMOS transistor 143 having a drain connected to the source of the NMOS transistor 142, and an NMOS transistor 144 having a drain connected to the source of the NMOS transistor 143. In addition, the source of the NMOS transistor 144 is an output node of the pump circuit 110. Drains of the NMOS transistors 142~144 are connected to their respective gates. A connecting node P1 connected between the NMOS transistor 142 and the NMOS transistor 143 is connected to one electrode of a capacitor C101. A connecting node P2 connected between the NMOS transistor 143 and the NMOS transistor 144 is connected to one electrode of a capacitor C102.

A clock signal CLK output from the oscillator circuit 112 and a detecting signal DET1 output from the potential detecting circuit 111 are input into the pump circuit 110. AND circuits 140 and 141 are controlled by the clock signal CLK and the detecting signal DET1. Furthermore, the clock signal CLK is input into the AND circuit 140 through an inverter G21 and is input into the AND circuit 141. Then, an output node N1 of the AND circuit 140 is connected to the other electrode of the capacitor C101, and an output node N2 of the AND circuit 141 is connected to the other electrode of the capacitor C102.

The potential detecting circuit 111 comprises resistors R1 and R0 connected in serial between the output node O1 of the pump circuit 110 and a common potential (such as ground potential) and a comparator CP1 having an inverse input terminal connected to a connecting node between resistors R1 and R0 and a non-inverse input terminal where a reference voltage VREF1 is input. The output of the comparator CP1 is taken as the detecting signal DET1 and is connected to the oscillator circuit 112 and the pump circuit 110.

The oscillator circuit 112 comprises an inverter G10 where the detecting signal DET1 is input, a clocked inverter G11 where the detecting signal DET1 is clock-input and the output of the inverter G10 is inversely clock-input, an inverter G12 where the output of the inverter G11 is input, and an inverter G13 where the output of the inverter G12 is input. The output of the inverter G13 is taken as the clock signal CLK and is connected to the pump circuit 110. In addition, the clock signal CLK is connected to the input of the inverter G11. Moreover, an NMOS transistor T1 is connected between a connecting node between the inverter G11 and the inverter G12 and the common potential. A gate of the NMOS transistor T1 is connected to the output of the inverter G10.

The charge pump circuit 110 used in the flash memory according to the first prior art as described above comprises a potential detecting circuit 111, including a resistor divider circuit DV1 constituted by the resistors R1 and R0 connected in serial, and a comparator CP1.

As disclosed in Patent Document 2, FIG. 10 is a circuit diagram showing the configuration of an internal voltage supplying circuit 200 according to the second prior art. As shown in FIG. 10, an external supply potential VCE is taken as an internal supply potential VCI through a PMOS transistor Q201 and is connected to a load 211. An inverse input terminal of a comparator 201 receives a reference potential Vref, and a non-inverse input terminal of the comparator 201 receives a divided internal supply potential DVCI which is taken as a feedback signal. A drain of the PMOS transistor Q201 is grounded through a resistor R211 and a resistor R212. Then, a voltage divided from the internal supply potential DVCI through the resistor R211 and the resistor R212 is taken as the divided internal supply potential DVCI and input into the non-inverse terminal of the comparator 201.

In the internal supply potential supplying circuit 200, according to the second prior art described above, an operating point of the comparator 201 may be freely selected regardless of set conditions of the internal supply potential VCI and the external supply potential VCE, and thus characteristics of the comparator 201 may be well maintained. Accordingly, the configuration may result in a special effect that the internal supply potential VCI is provided stably with a specific reference potential Vref.

As disclosed in Patent Document 3, FIG. 11 is circuit diagram showing the configuration of an internal voltage generating circuit 300 according to the third prior art. An example where the internal voltage generating circuit 300 comprises a DC-DC converter 313 is shown.

In FIG. 11, an internal supply voltage V0 from the DC-DC converter 313 is output to a logic circuit 306 and a voltage controlled oscillating unit 302 as well. The voltage controlled oscillating unit 302 outputs an oscillating signal having a frequency fv that corresponds to the input internal supply voltage V0 to a frequency comparing unit 311. For example, the frequency comparing unit 311 consists of a counter for counting the frequency of the output signal fv of the oscillating unit 302, a counter for counting a frequency of a reference clock fref, and a comparator for comparing the values of the two counters. The frequency comparing unit 311 may consist of a frequency/phase comparator for comparing frequencies and phases. Moreover, the frequency comparing unit 311 may also consist of a phase comparator. A controlling clock generating unit 312 controls the duty ratios of two clocks G1 and G2 according to the results of frequency comparison.

The internal voltage generating circuit 300 described above controls the internal supply voltage V0 according to the frequency fref of the reference clock.

FIG. 12 is a block diagram of a NAND-type flash memory 2E according to the fourth prior art.

In FIG. 12, the NAND-type flash memory 2E according to the fourth prior art comprises: a NAND-type flash memory block 10 including a data register 10R; a controller 20 controlling the operations of the whole NAND-type flash memory 2E; a reference voltage generator 30 that generates a predetermined reference voltage Vref; pump circuits 31-1~31-N that boost the supply voltage to a predetermined voltage, which is a predetermined multiple of the reference voltage Vref; internal voltage generators 32-1~32-N that generate predetermined internal voltages V1~VN based on the reference voltage Vref and voltages from the pump circuits 31-1~31-N; and a BIST (Built-in Self Test) circuit 3E connected to a test device 1 through a multi-purpose probing pad MP, wherein the test device 1 is an external device performing the testing of the memory chip. Here, the BIST circuit 3E comprises: a switch circuit 33 for outputting a selected one of the reference voltage Vref and the internal voltages V1~VN as an internal voltage Vin according to a control signal from a trimming controller 35A; a resistor dividing circuit 36 for outputting a resistor-divided voltage divided from the internal voltage Vin by resistors; a comparator 37 for comparing the voltage from the resistor dividing circuit 36 and an external reference voltage EVref from a test device 1 and outputting a signal of the comparison results; and the trimming controller 35A for being operated based on the control signal from the controller 20, including a determining circuit for determining a signal from the comparator 37 so as to generate a control signal to the switch circuit 33, and performing voltage control on a reference voltage generator 30 and the internal voltage generators 32-1~32-N.

FIG. 13 is a flow chart of an internal voltage trimming process performed by the trimming controller 35A shown in FIG. 12.

In FIG. 13, in step S1, the internal voltage Vin is set to a voltage that corresponds to the first trimming code (initial value). That is, the trimming code TC is set to be 1. Here, as the trimming code TC is changed, the voltage may change within a range of 6.0 V to 7.5 V by, for example, 0.5 V or 0.1 V at a time. Next, in step S2, switching to a programming mode of the memory is performed. In step S3, a waiting for the sake of circuit programming stability, such as a waiting with 20 µs, is performed. Then, in step S4, the internal voltage Vin is applied to the resistor dividing circuit 36. In step S5, a waiting with 10 ms considering a circuit time constant is performed. Moreover, in step S6, the comparator 37 and the trimming controller 35A are used to calculate an average value of ten internal voltages Vin which are measured at ten times. Then, in step S7, it is determined whether the average value of the internal voltage Vin is larger than a target value. If the result of step S7 is NO, the process proceeds to step S8.

In step S8, by incrementing the trimming code TC by 1, the internal voltage Vin is incremented by a predetermined increment, and then the process proceeds to step S2 to repeat steps described above. If the average of the internal voltage Vin is larger than the target value in step S7, it is determined that the internal voltage Vin is close to and slightly exceeds the predetermined target value, and then the process ends.

Patent Documents
[Patent Document 1] JP 2009-232486
[Patent Document 2] JP H10-027026
[Patent Document 3] JP H09-285109
[Patent Document 4] JP 2001-229697

BRIEF SUMMARY OF THE INVENTION

Problems to be Solved

For adjusting the internal voltages V1~VN and Vref by using the trimming controller 35A described above, the BIST circuit 3E is configured for comparing the internal voltage Vin going through the switch circuit with the external reference voltage EVref. Conventionally, since the BIST circuit comprises the resistor dividing circuit 36 and the comparator 37 as described above, there may be a problem that the internal voltages V1~VN and Vref cannot be precisely adjusted.

Because the described resistor dividing circuit 36 comprises a plurality of resistors, the flowing consumption current becomes extra current for the charge pump, and thus there may a problem that the voltage accuracy, especially the voltage accuracy of high voltage, is decreased. And if total resistance of those resistors connected in serial is large, the delay of the corresponding CR time constant will be a big problem.

$$20V/10\mu A = 2M\Omega \qquad \text{[Equation 1]}$$

$$20V/1\mu A = 20M\Omega \qquad \text{[Equation 2]}$$

Furthermore, if a resistance value of a resistor is larger, the occupied space is larger, and thus the semiconductor material should be a problem. If the extra current is 10 µA, the extra current is extremely large relative to a pump circuit of 24V for example.

In addition, in the BIST circuit 3E, variations in the resistors of the resistor dividing circuit 36 and the offset of the comparator 37 are also problems. If the resistive dividing ratio is 1/10, an inaccuracy of a voltage of 0.01V means an inaccuracy of 0.1V in the external voltage. Nevertheless, a small resistive dividing ratio may be a problem of the supply voltage in the comparator 37. That is, the divided voltage needs to be smaller than the supply voltage.

The purpose of the invention is to solve the problems described above. Therefore, the invention provides an internal voltage trimming circuit having a simple configuration which can be operated by a smaller consumption current than that of prior arts without using a resistive voltage divider and a comparator, a method thereof and a semiconductor circuit device having the internal voltage trimming circuit.

Means for Solving the Problems

An internal voltage trimming circuit according to an embodiment of the invention comprises: a control means, trimming an internal voltage by using a change in a counting value of a clock, wherein the internal voltage is generated by an internal voltage generator of a semiconductor device, and the clock is generated by a clock generator according to current flowing through a transistor of a power supply current source for the clock generator. The control means counts a first counting value of the clock generated by the clock generator when a predetermined reference voltage is applied to a control terminal of the transistor and a second counting value of the clock generated by the clock generator when the internal voltage is applied to the control terminal of the transistor, and the control means controls the internal voltage generated by the internal voltage generator to make the second counting value substantially coincide with the first counting value.

The internal voltage trimming circuit further comprises a current source, generating an offset current to be added for the current flowing through the transistor of the power supply current source. The control means controls the offset current to make the first counting value of the clock generated by the clock generator when the predetermined reference voltage is applied to the control terminal of the transistor be a predetermined value.

Moreover, the internal voltage trimming circuit further comprises a voltage dividing circuit, dividing the internal voltage into a predetermined voltage through capacitive division or resistive division and applying the divided voltage to the control terminal of the transistor.

In addition, the internal voltage trimming circuit further comprises: a plurality of transistors of the power supply current source for the clock generator; and a selecting means, selectively operating one of the plurality of transistors. The control means applies a plurality of internal voltages to control terminals of the plurality of transistors and trims the plurality of internal voltages by sequentially and selectively operating the plurality of transistor through the selecting means.

The internal voltage trimming circuit further comprises: a plurality of transistors of the power supply current source for the clock generator; a selecting means, selectively operating one of the plurality of transistors; and a current source, generating an offset current to be added for the current flowing through the transistor of the power supply current source. Each of the reference voltage and at least one internal voltage is applied to a control terminal of a corresponding one of the plurality of transistors. The control means applies a predetermined same voltage to the control terminals of the plurality of transistors, sequentially and selectively operates the plurality of transistor through the selecting means, and controls the offset current to make a plurality of counting values of the clock generated by the clock generator be the same with each other, so as to compensate variations among the plurality of transistors. After the variations among the plurality of transistors are compensated, the control means selectively operates the plurality of transistor through the selecting means, applies each of the reference voltage and the at least one internal voltage to a control terminal of a corresponding one of the plurality of transistors sequentially, and trims the at least one internal voltage.

In the internal voltage trimming circuit described above, the plurality of transistors comprises a first transistor, the reference voltage is applied to a control terminal of the first transistor via a switch element, and the internal voltage is applied to the control terminal of the first transistor.

Moreover, in the internal voltage trimming circuit described above, the plurality of transistors comprises a first and a second transistor, the reference voltage is applied to a control terminal of the first transistor, the reference voltage is applied to a control terminal of the second transistor via a switch element, and the internal voltage is applied to the control terminal of the second transistor.

Besides, in the internal voltage trimming circuit described above, the plurality of transistors comprises a first, a second and a third transistor, the reference voltage is applied to a control terminal of the first transistor, the reference voltage is applied to a control terminal of the second transistor via a first switch element, the reference voltage is applied to a control terminal of the third transistor via a second switch element, the internal voltage is applied to the control terminal of the second transistor, and a high voltage having an internal voltage higher than the internal voltage is applied to the control terminal of the third transistor.

A semiconductor device according to another embodiment of the invention comprises the internal voltage trimming circuit described above.

According to still another embodiment of the invention, an internal voltage trimming method for using a change in a counting value of a clock generated by a clock generator according to current flowing through a transistor of a power supply current source for the clock generator to trim an internal voltage generated by an internal voltage generator of a semiconductor circuit device is provided. The internal voltage trimming method comprises: a step of counting a first counting value of the clock generated by the clock generator when a predetermined reference voltage is applied to a control terminal of the transistor; and a step of counting a second counting value of the clock generated by the clock generator when the internal voltage is applied to the control terminal of the transistor and controlling the internal voltage generated by the internal voltage generator to make the second counting value substantially coincide with the first counting value.

The internal voltage trimming method further comprises a step of controlling an offset current of a current source generating the offset current which is added for the current flowing through the transistor of the power supply current source to make the first counting value of the clock generated by the clock generator when the reference voltage is applied to the control terminal of the transistor be a predetermined value.

Effect of the Invention

Accordingly, an internal voltage trimming circuit having a simple configuration which can be operated by a smaller consumption current than that of prior arts without using a resistive voltage divider and a comparator and a method for the internal voltage trimming circuit are provided in the invention.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 4 illustrates a relationship between a voltage $V_A$ of a node A in FIG. 1 and a 10000 CLK period;

DETAILED DESCRIPTION OF THE INVENTION

The embodiments of the invention are described below with references made to the accompanying drawings. The same element in every embodiment below is marked as the same symbol.

First Embodiment

Figure 1:
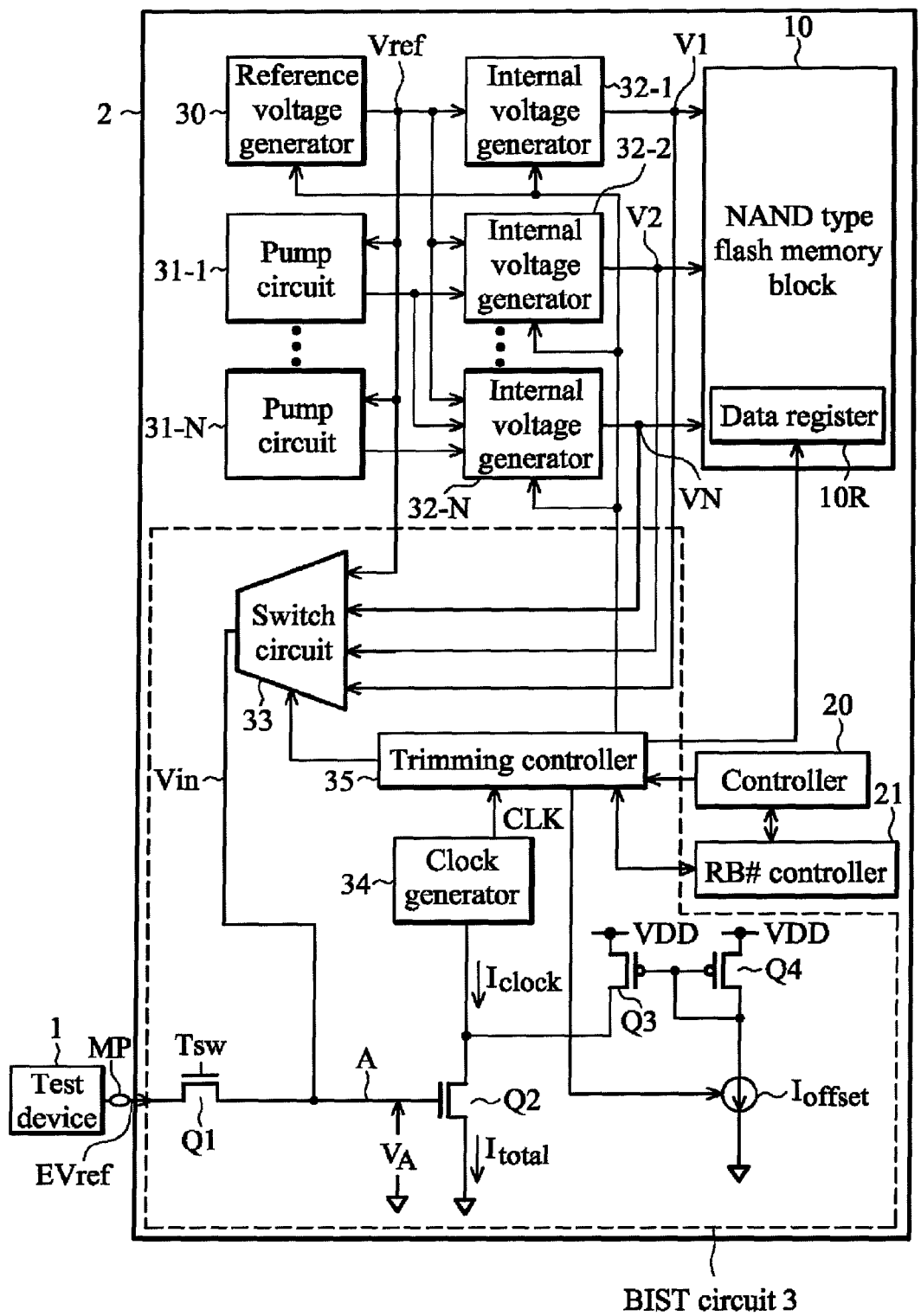
FIG. 1 is a block diagram of a NAND-type flash memory 2 according to the first embodiment of the invention.

FIG. 1 is a block diagram of a NAND-type flash memory 2 according to the first embodiment of the invention.

In FIG. 1, the NAND-type flash memory 2 according to the first embodiment comprises: a NAND-type flash memory block 10, having a data register 10R; a controller 20, generating all control signals and select signals and controlling operations of the whole NAND-type flash memory 2E; a RB# controller 21, generating a RB# signal indicating that the operation status is ready or busy; a reference voltage generator 30, generating a predetermined reference voltage Vref; N pump circuits 31-1~31-N, boosting the supply voltage to a predetermined voltage which is a predetermined multiple of the reference voltage Vref; N internal voltage generators 32-1~32-N, generating predetermined internal voltages V1~VN which are different from each other based on the reference voltage Vref and voltages from the pump circuits 31-1~31-N (such as VrekV1<V2< . . . <VN); and a BIST (Built-In Self Test) circuit 3, connected to a test device 1 through a probing pad named multipad MP, wherein the test device is an external device performing a test of the memory chip.

Here, changing a counting value of a clock generated by a clock generator corresponding to a current flowing through a transistor of a power supply current source for a clock oscillator according to the embodiment is used. An internal voltage trimming circuit comprises a trimming controller 35 for trimming internal voltages generated by internal voltage generators of the semiconductor circuit device. The trimming controller 35 counts a first counting value of the clock generated by the clock generator when the reference voltage is applied to a control terminal of the transistor, counts a second counting value of the clock generated by the clock generator when the internal voltage is applied to the control terminal of the transistor, and controls the internal voltage generated by the internal voltage generator to make the second counting value substantially coincide with the first counting value.

In FIG. 1, the BIST circuit 3 comprises: a switch circuit 33, outputting a selected one of the reference voltage Vref and the internal voltages V1~VN as an internal voltage Vin according to a control signal from a trimming controller 35; a clock generator 34, generating a clock CLK having a predetermined clock frequency; the trimming controller 35, operating based on control signals of the controller 20 and the RB# controller 21, generating a control signal to the switch circuit 33, comprising a clock counter for counting the clock of the clock generator 34, performing voltage controlling on a reference voltage generator 30 and the internal voltage generators 32-1~32-N and generating a control signal of a switch element in the BIST circuit 30 (a control signal Tsw of a MOS transistor Q1 in FIG. 1); a MOS transistor Q1, switching to determine whether an external reference voltage EVref from the test device 1 is to be input; a MOS transistor Q2, generating a total current Itotal controlling a clock current Iclock of the power supply current source of the clock generator; and MOS transistors Q3 and Q4, generating an offset current Ioffset for adjusting the clock current Iclock toward the MOS transistor Q2 and supplying a corresponding current. In addition, the BIST circuit 3 becomes having high impedance when the pump circuit 31-N and the switch circuit 33 are not turned on, and the output voltage is not output.

The external reference voltage EVref from the test device 1 is applied to a node A connected to a gate (control terminal) of the MOS transistor Q2 through the multipad MP and the MOS transistor Q1 which is on or off according to the control signal Tsw (the MOS transistor Q1 is a switch element switching to determine whether the external reference voltage EVref is to be input). In addition, the internal voltage Vin from the switch circuit 33 is applied to the node A. The MOS transistors Q3 and Q4 construct a current mirror circuit. When the offset current Ioffset flows through the MOS transistor Q4, the corresponding current which is the same as the offset current Ioffset flows through the MOS transistor Q3 (for example, when the MOS transistors Q3 and Q4 have the same size, the currents flowing through the transistors are the same; when they have different sizes, a ratio of currents flowing through the transistors changes according to a size ratio of the transistors). The corresponding current and the clock current Iclock are combined to be the total current Itotal flowing through the MOS transistor Q2. The relationship is described by Equation 3 as following, $$I\text{total} = I\text{clock} + I\text{offset} \quad [\text{Equation 3}].$$

In the BIST circuit 3 described above, the external reference voltage EVref from the test device is applied to the node A connected to the gate of the MOS transistor Q2 constituting the power supply current source of the clock generator 34 through the multipad MP and the MOS transistor Q1. The clock frequency of the clock generated by the clock generator 34 changes based on a function of the voltage $V_A$ of the node A. After the trimming controller 35 controls the offset current Ioffset to conform the counting value counted by the clock counter to a predetermined target value Ncref, the MOS transistor Q1 is turned off, and the internal voltage Vin is applied to the node A to check the counting value of the clock. Here, the trimming controller 35 performs controlling to make the counting value of the clock coincide with the target value Ncref by changing the trimming code TC and thus changing the internal voltage Vin (=the internal voltage VN or Vref). At this time, the internal voltage Vin will be coincided with the external reference voltage EVref.

Figure 2:
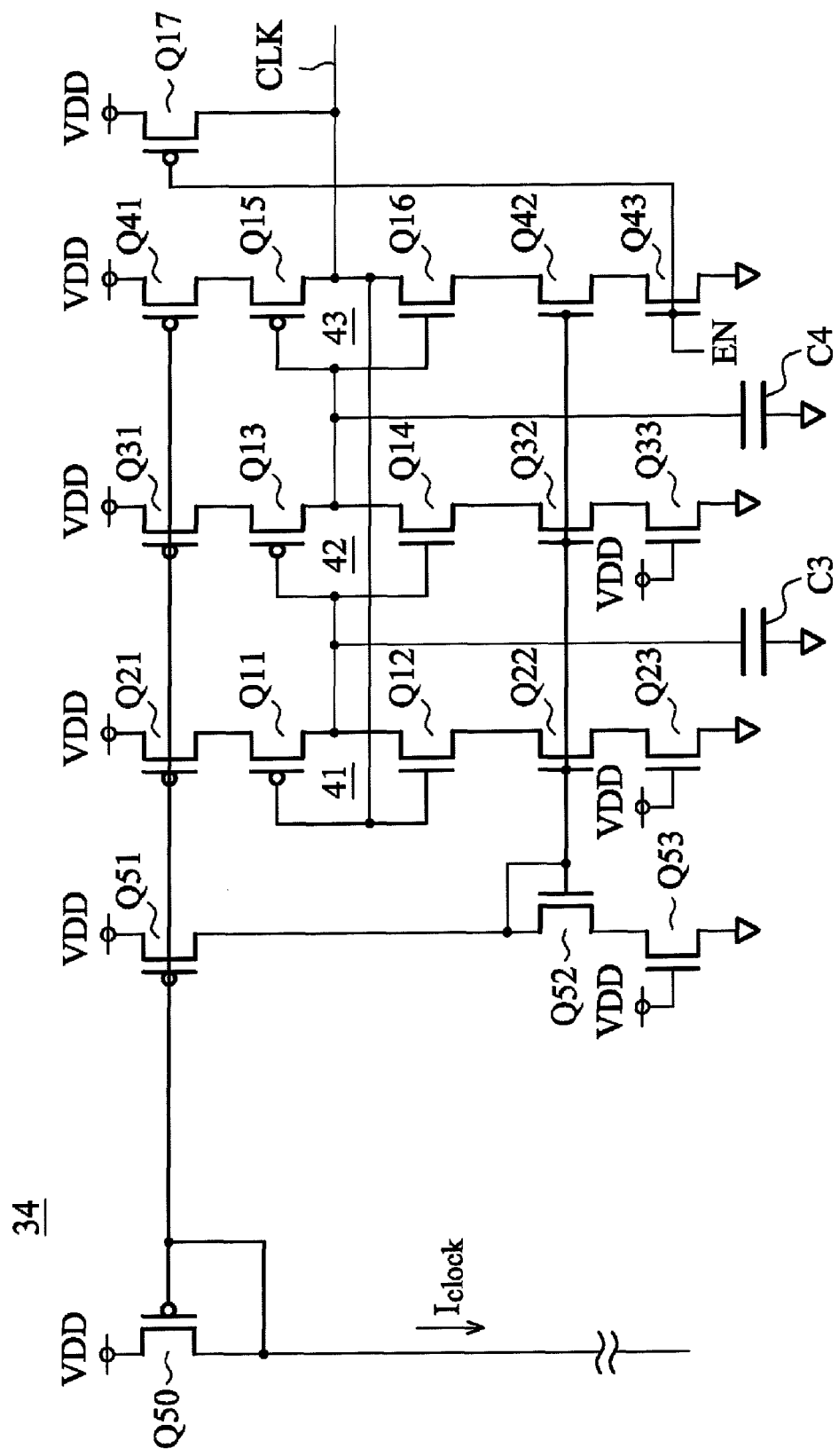
FIG. 2 is a circuit diagram showing a detailed configuration of a clock generator 34 in FIG. 1.

FIG. 2 is a circuit diagram showing a detailed configuration of the clock generator 34 in FIG. 1. In FIG. 2, the clock generator 34 comprises a ring oscillator having an inverter 41 constituted by MOS transistors Q11 and Q12, an inverter 42 constituted by MOS transistors Q13 and Q14 and an inverter 43 constituted by MOS transistors Q15 and Q16, wherein the inverters are circularly connected. MOS transistors Q17 and Q43 are configured to control outputs according to an enable signal EN. The clock CLK is output from the output terminal of the inverter 43. Moreover, MOS transistors Q50, Q51, Q21, Q31 and Q41, in a circuit for the power supply current of the positive electrode side, constitute a current mirror circuit. In the current mirror circuit, currents corresponding to the clock current Iclock flowing through the MOS transistor Q50 flow to the ring oscillator. MOS transistors Q52, Q53, Q22, Q23, Q32, Q33 and Q42 are in a circuit for the power supply current of the negative electrode side. Capacitors C3 and C4 have capacitances for adjusting the clock frequency of the ring oscillator.

In the clock generator 34 described above, when the clock current Iclock changes, the power supply current supplied to the ring oscillator is changed correspondingly, and thus the clock frequency is changed. Specifically, if the clock current Iclock becomes larger, the clock frequency becomes higher.

Figure 3:
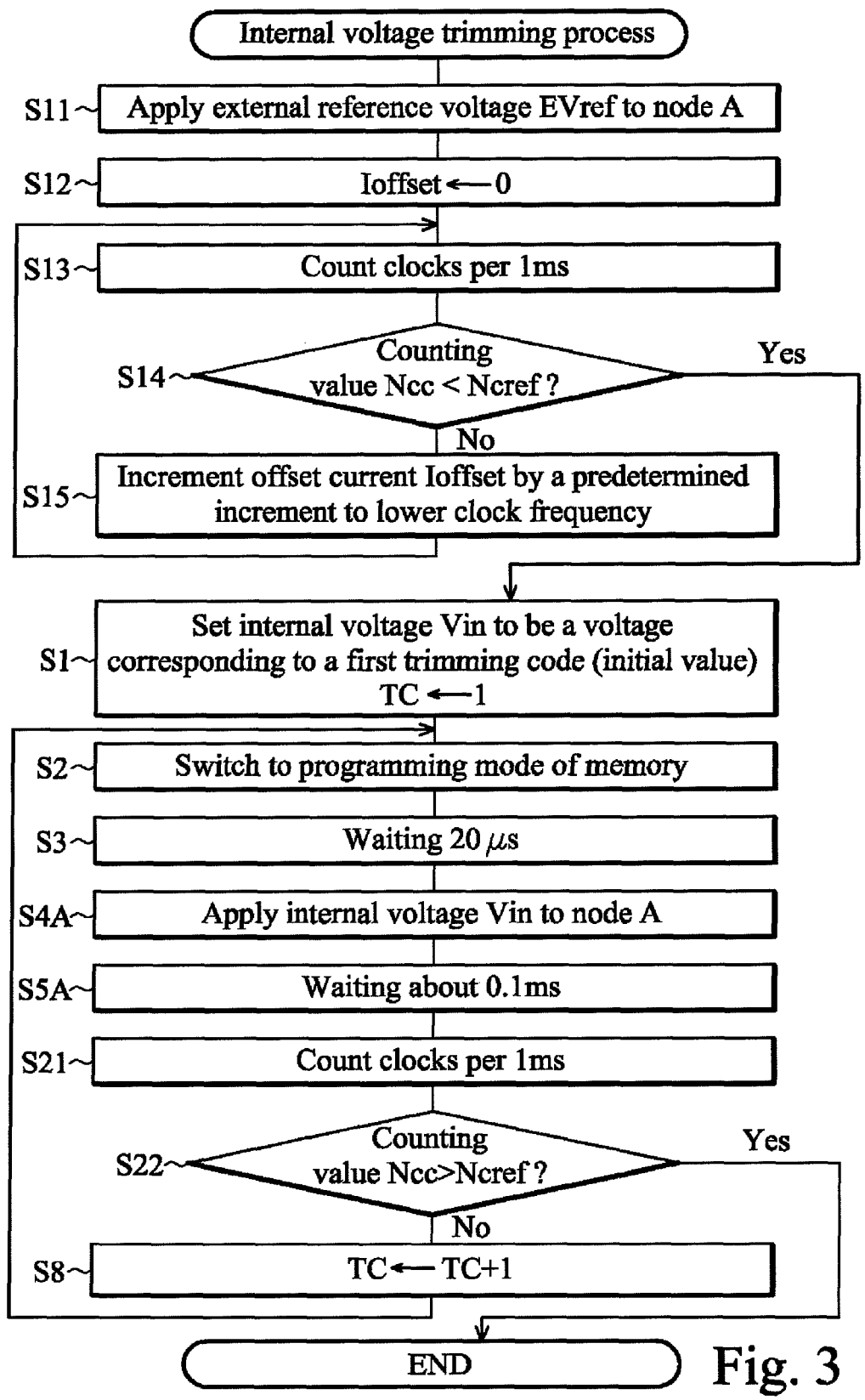
FIG. 3 is a flow chart of an internal voltage trimming process performed by a trimming controller 35 in FIG. 1.

FIG. 3 is a flow chart of an internal voltage trimming process performed by the trimming controller 35 in FIG. 1. In FIG. 3, steps which are the same as in FIG. 13 are marked in the same step numbers.

In FIG. 3, in step S11, the external reference voltage EVref is applied to the node A. In step S12, the offset current Ioffset is set to be 0. Then, in step S13, clocks per 1 ms is counted. In step S14, whether the counting value Ncc is smaller than Ncref is determined. If the result of step S14 is YES, the process proceeds to step S1. If the result of step S14 is NO, the process proceeds to step S15. In step S15, the offset current is incremented by a predetermined increment to lower the clock frequency and then the process goes back to step S13. Next, in step S1, the internal voltage Vin is set to be the voltage corresponding to a first trimming code (initial value). That is, the trimming code TC is set to be 1. In step S2, moving to a programming mode of the memory is performed. In step S3, a waiting for the sake of stability of circuit programming operation, such as a waiting with 20 µs, is performed. In step S4A, the internal voltage Vin is applied to the node A. In step S5A, a waiting with about 0.1 ms is performed. Then, in step S21, clocks per 1 ms is counted. In step S22, whether the counting value Ncc is larger than Ncref is determined. If the result of step S22 is NO, the process proceeds to step S8. In step S8, the trimming code TC is incremented by 1 to add a predetermined increment voltage into the internal voltage Vin, and then the process proceeds to step S2. If the result of step S22 is YES, the process ends.

Figure 13:
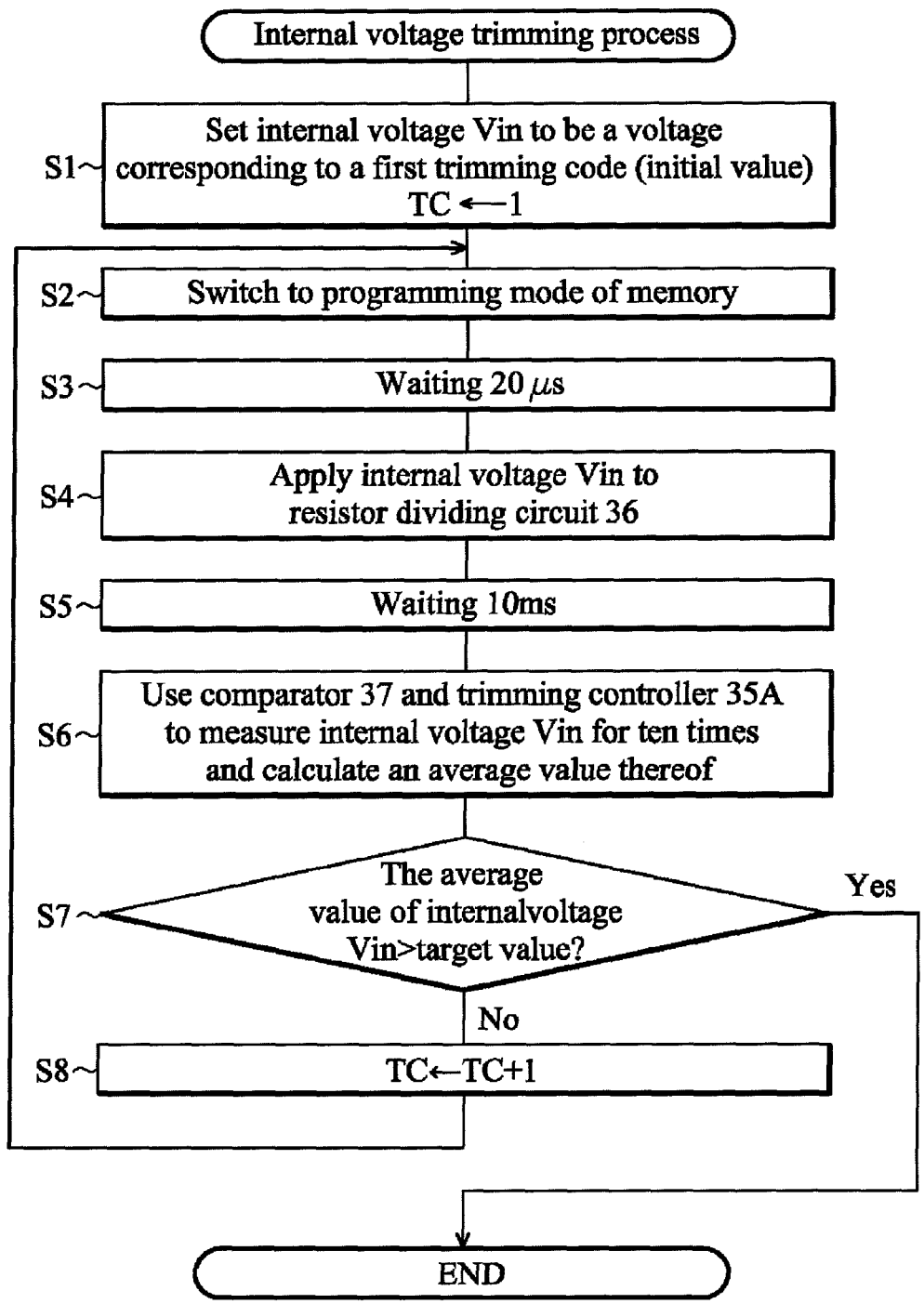
FIG. 13 is a flow chart of an internal voltage trimming process performed by a trimming controller 35A in FIG. 12.

The embodiment described above has special features described as following:

(1) Comparing FIG. 3 with FIG. 13, though steps S11~S15 are added in FIG. 3, the processing time in FIG. 3 is extremely reduced. In FIG. 3, the waiting in step S5A takes about 0.1 ms and the comparison between the internal voltage and the external reference voltage is performed once to count clocks per 1 ms in step S21. On the other hand, in step S13, the waiting in step S5 takes 10 ms and the internal voltage has to be measured for ten times to calculate the average value. Thus, the processing time in FIG. 3 is extremely reduced than that in FIG. 13.

(2) Since the external reference voltage EVref, such as 24V, can pass through the MOS transistor Q1, the resistor dividing circuit is not needed.

(3) The internal voltage Vin can be directly applied to the node A, and thus the consumption current is not increased. Moreover, the inaccuracy caused by the inaccurate resistive dividing ratio is eliminated.

(4) When voltages from the pump circuits 31-1~31-N are applied, since the consumption current is not flowing through the resistor, the trimming can be performed in the same load status as the actual memory operation.

(5) Since the resistor dividing circuit 36 and the comparator 37 are not used, the trimming is not influenced by variations in resistors or the offset of the comparator.

(6) Since the clock counter has an extremely simple configuration, the comparison of counting values is extremely simple, and thus the BIST circuit 3 can have a configuration which is much simpler than that in prior arts.

(7) As described above, the trimming of the internal voltage Vin can be performed precisely.

The embodiment described above has high resolution for such as the NAND-type flash memory. The resolution of the embodiment will be described as following. FIG. 4 illustrates a relationship between the voltage $V_A$ of the node A in FIG. 1 and a 10000 CLK period. As shown in FIG. 4, for example, after the offset current Ioffset is adjusted, when the target voltage of the node voltage $V_A$ is 30V and the 10000 CLK period (Tvref) is 1 ms, a voltage difference of 50 mV has a 2.6% shift in the 10000 CLK period, which corresponds to 260 cycles. Accordingly, the voltage resolution is 0.2 mV as calculated below:

$$50 mV/260 \text{ cycles} = 0.2 mV \qquad \text{[Equation 4]}.$$

In the measurement of a practical NAND type memory, 10 mV is an accurate limit value of the measurement. Thus, as for 0.2 mV described above, the resolution of the device and the method according to the embodiment is extremely good.

Second Embodiment

Figure 5:
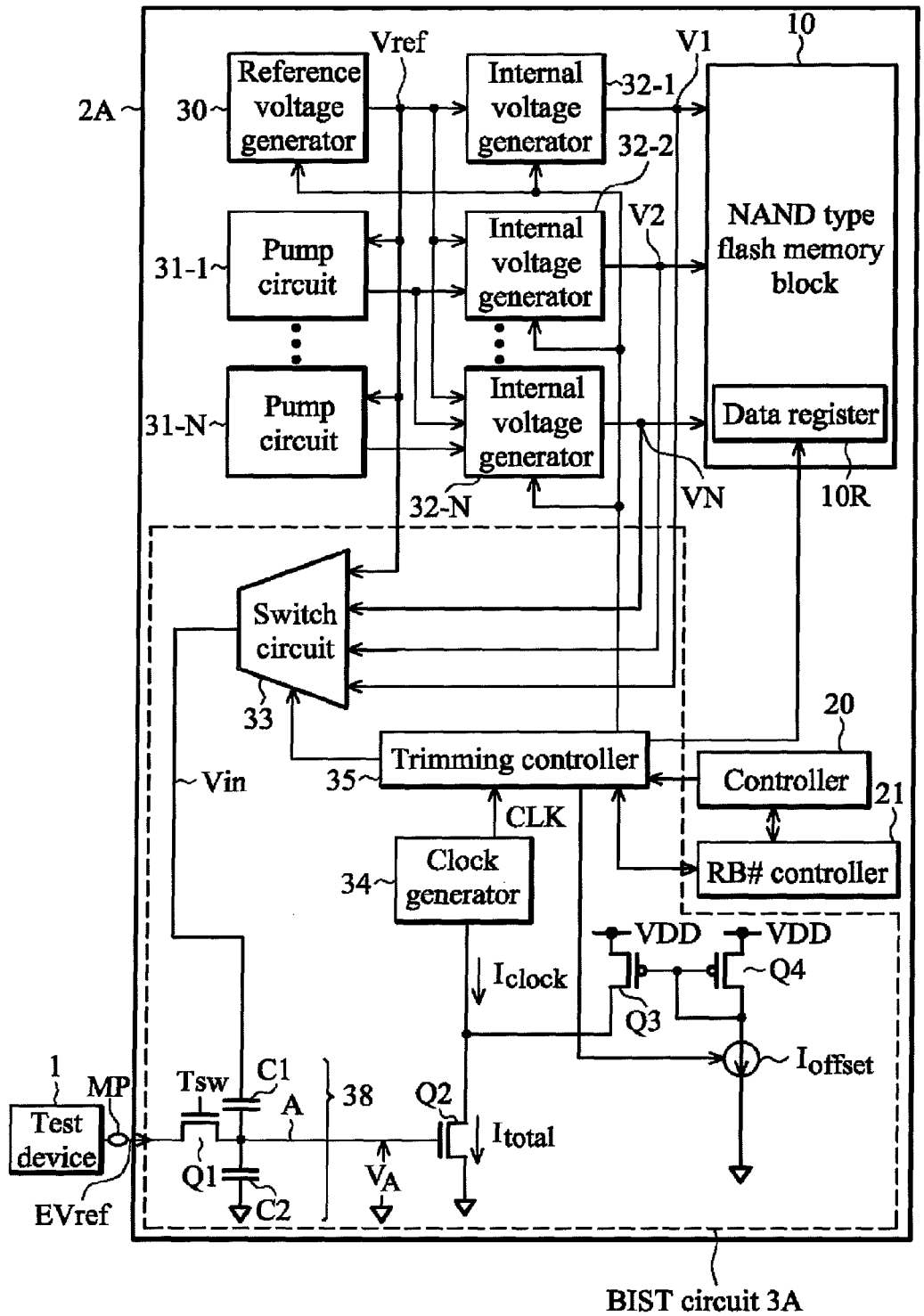
FIG. 5 is a block diagram of a NAND-type flash memory 2A according to the second embodiment of the invention.

FIG. 5 is a block diagram of a NAND-type flash memory 2A according to the second embodiment of the invention. The NAND-type flash memory 2A according to the second embodiment comprises a BIST circuit 3A. The difference between the BIST circuit 3A and the BIST circuit 3 in FIG. 1 is as following:

(1) A capacitor C1 is inserted between the node A and the output terminal of the switch circuit 33; and (2) A capacitor C2 is inserted between the node A and the ground.

In FIG. 5, the capacitance of the capacitor C1 is set to be equal to the capacitance of the capacitor C2. For example, when the external reference voltage EVref is 15V, the internal voltage Vin may be set to be 30V (twice of the EVref). That is, after the capacitors C1 and C2 are reset to be discharged to 0V, a voltage which is a half of the internal voltage Vin is generated on the node A by applying the internal voltage Vin to the capacitors C1 and C2. The capacitors C1 and C2 constitute a capacitor dividing circuit 38. Moreover, the external reference voltage EVref is applied to the multipad MP, the MOS transistor is turned on by the control signal Tsw to apply the external reference voltage EVref to the node A, the offset current Ioffset is adjusted, and the clock frequency is adjusted to Ncref. Next, after the capacitors C1 and C2 are reset, the MOS transistor Q1 is turned off and thus the node A is floating. If the internal voltage Vin is applied, the voltage on the node A is a half of the internal voltage Vin as described above. Therefore, after the trimming code TC is adjusted, the internal voltage Vin is twice of the external reference voltage EVref. Here, the operation is delayed only for reset time but still effective when the internal voltage Vin is higher than the external reference voltage EVref. For example, when the internal voltage Vin is 30V, in contrast to the case when the conventional external reference voltage is about 1.3V, the error is improved to be less than 1/10.

Though the capacitors C1 and C2 are used to divide the internal voltage Vin by capacitors in the embodiment, the invention is not limited thereto. Resistors corresponding to the capacitors C1 and C2 may be used to divide the internal voltage Vin by resistors.

Third Embodiment

Figure 6:
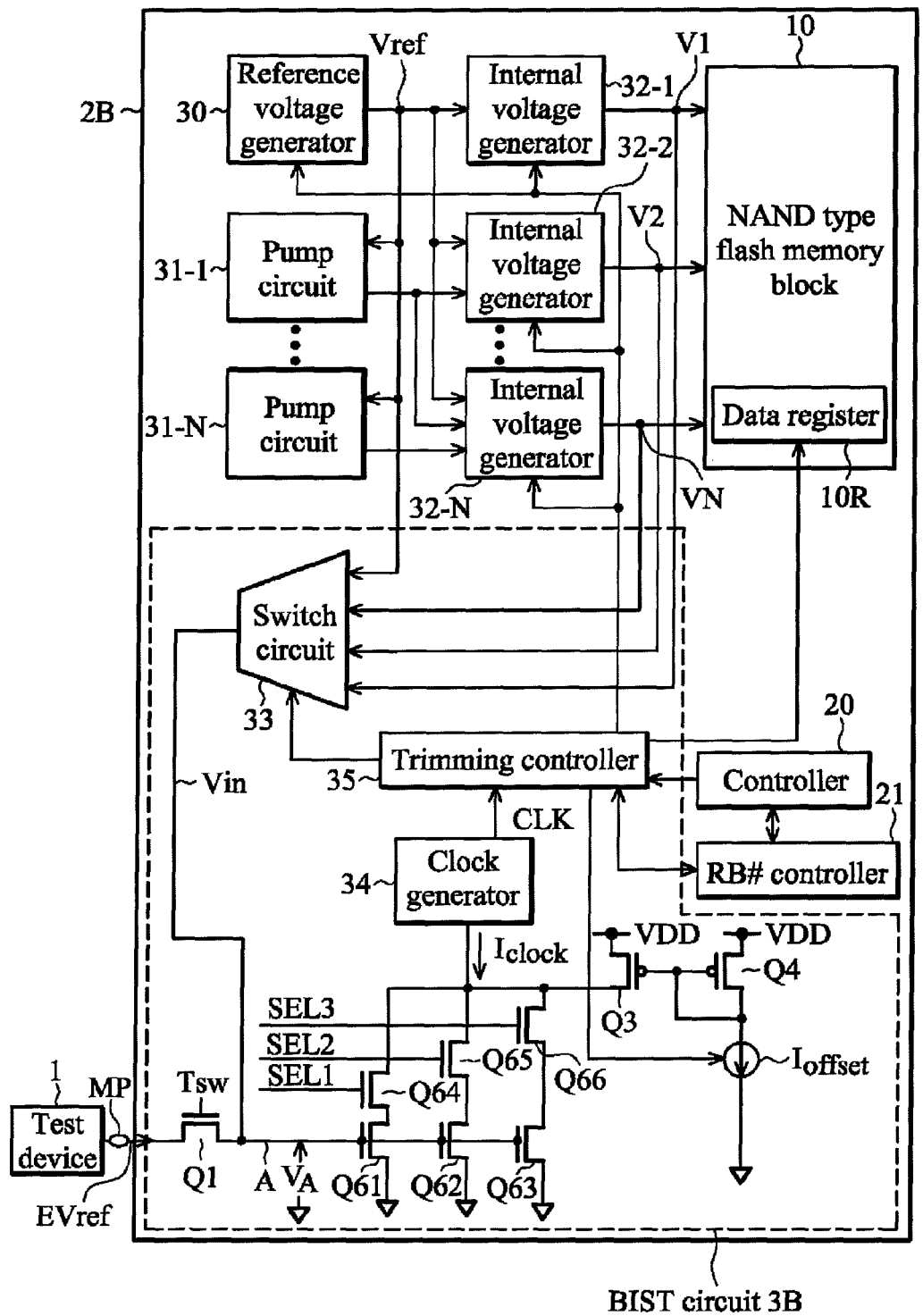
FIG. 6 is a block diagram of a NAND-type flash memory 2B according to the third embodiment of the invention.

FIG. 6 is a block diagram of a NAND-type flash memory 2B according to the third embodiment of the invention. The NAND-type flash memory 2B according to the third embodiment comprises a BIST circuit 3B. The difference between the BIST circuit 3B and the BIST circuit 3 in FIG. 1 is as following:

(1) The BIST circuit 3B comprises MOS transistors Q61, Q62 and Q63, whose sizes are different from each other, and the MOS transistors take the place of the MOS transistor Q2 of the power supply current source; and (2) The MOS transistors Q61, Q62 and Q63 are connected to the MOS transistor Q3 and the clock generator 34 through selective MOS transistors Q64, Q65 and Q66, respectively.

In FIG. 6, gates of the MOS transistors Q61, Q62 and Q63 are connected to the node A, drains of the MOS transistors Q61, Q62 and Q63 are connected to the ground, and sources of the MOS transistors Q61, Q62 and Q63 are connected to the MOS transistor Q3 and the clock generator 34 through the selective MOS transistors Q64, Q65 and Q66, respectively. Moreover, select signals SEL1, SEL2 and SEL3 from the trimming controller 35, connected to the selective MOS transistors Q64, Q65 and Q66, respectively, are used to select one of the MOS transistors. In the BIST circuit 3B as described above, since the sizes of the MOS transistors Q61, Q62 and Q63 are different from each other, the bias condition of the most suitable transistor can be set by selecting one of the MOS transistors according to the value of the internal voltage Vin regarding the clock current Iclock. Therefore, in contrast to the first embodiment, the measurement accuracy of the clock frequency, i.e., the measurement accuracy of the internal voltage, is improved.

Fourth Embodiment

Figure 7:
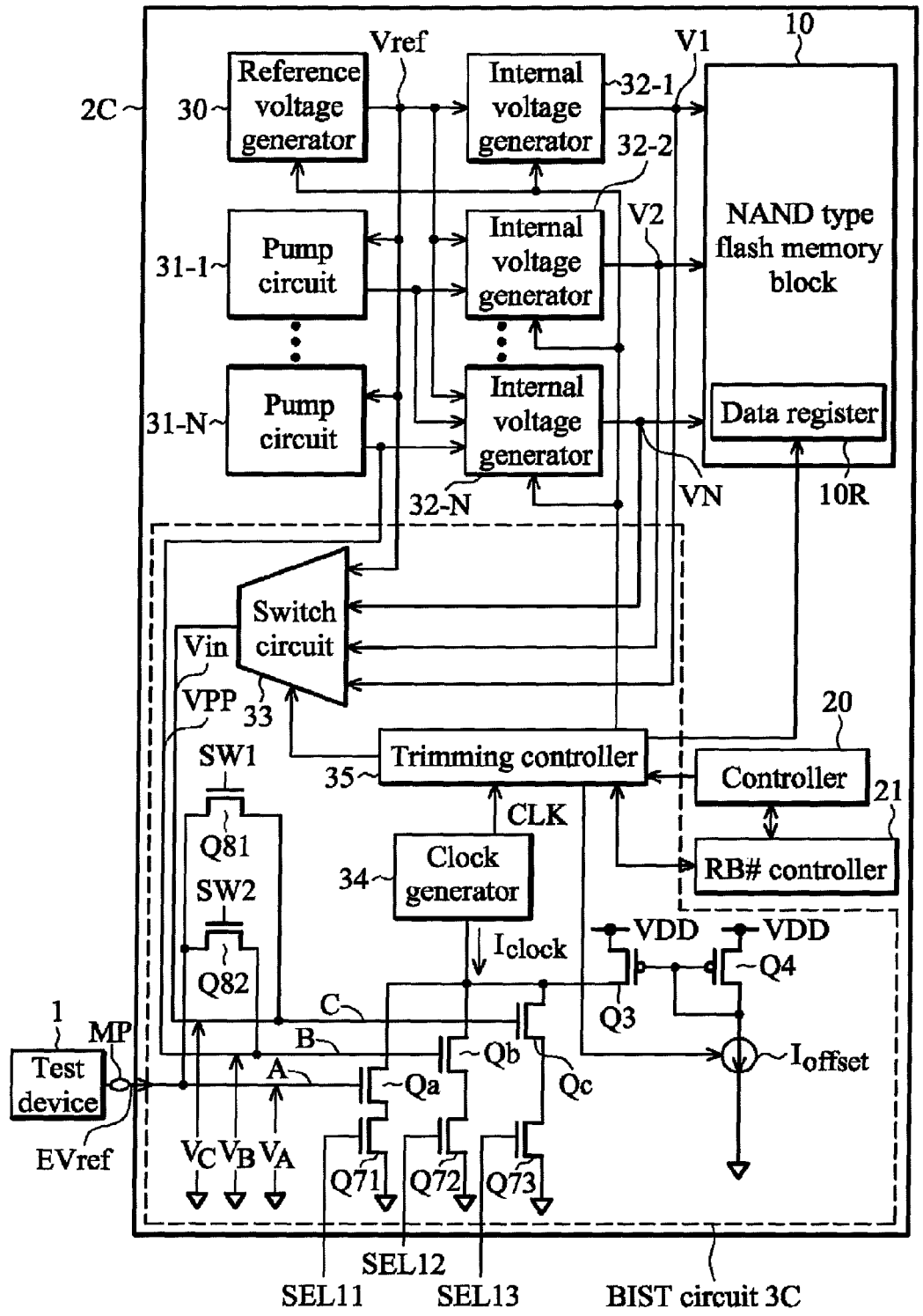
FIG. 7 is a block diagram of a NAND-type flash memory 2C according to the fourth embodiment of the invention.

FIG. 7 is a block diagram of a NAND-type flash memory 2C according to the fourth embodiment of the invention. The NAND-type flash memory 2C according to the fourth embodiment comprises a BIST circuit 3C. The difference between the BIST circuit 3C and the BIST circuit 3 in FIG. 1 is as following:

(1) The MOS transistor Q1, switching to determine whether the external reference voltage EVref is to be input, is omitted;

(2) The MOS transistors Qa, Qb and Qc, whose sizes are different from each other, take the place of the MOS transistor Q2 of the power supply current source;

(3) The MOS transistors Qa, Qb and Qc are connected to the MOS transistor Q3 through selective MOS transistors Q71, Q72 and Q73, respectively; and (4) The MOS transistors Q81 and Q82 are provided as switch elements to selectively input the external reference voltage EVref.

In FIG. 7, a gate of the MOS transistor Qa is connected to the node voltage $V_A$ of the node A, a gate of the MOS transistor Qb is connected to a node voltage $V_B$ of the node B and is connected to the multipad MP through the MOS transistor Q82, and a gate of the MOS transistor Qc is connected to a node voltage $V_C$ of the node C and is connected to the multipad MP through the MOS transistor Q81. Drains of the MOS transistors Qa, Qb and Qc are connected to the MOS transistor Q3 and the clock generator 34, and sources of the MOS transistors Qa, Qb and Qc are grounded through the selective MOS transistors Q71, Q72 and Q73, respectively. In addition, select signals SEL11, SEL12 and SEL13 from the trimming controller 35, connected to the selective MOS transistors Q71, Q72 and Q73, respectively, are used to select one of the MOS transistors. The external reference voltage EVref from the test device 1 is applied to the node A through the multipad MP, the node B through the MOS transistor Q82 and the node C through the MOS transistor Q81. Moreover, the MOS transistors Q71, Q72 and Q73 substantially have the same size.

In the BIST circuit 3C described above, the MOS transistor taken as the input switch element is omitted. The external reference voltage EVref input from the test device through the multipad MP, the internal voltage Vin from the switch circuit 33 and the high voltage VPP (VPP>VN) from the pump circuit 31-N are received by the MOS transistors Qa, Qb and Qc, respectively. Then, the MOS transistors Q81 and Q82, i.e., switch elements for compensating effects of variations of the MOS transistors Qa, Qb and Qc which are measured in advance, are configured.

(Step SS1) Firstly, the switch circuit 33 is turned off, EVref is applied to the multipad MP setting the offset current Ioffset to be a predetermined initial value, MOS transistors Q81 and Q82 are turned off by control signals SW1 and SW2, and the MOS transistor Q71 is turned on by the select signal SEL11. Then, only the MOS transistor Qa is operated, the clock at that time is counted, and the counting value is adjusted to match Ncref by adjusting Ioffset.

(Step SS2) Next, the MOS transistor Q82 is turned on by the control signal SW2, the MOS transistor Q71 is turned off by the select signal SEL11 and the MOS transistor Q72 is turned on by the select signal SEL12. Then, Only the MOS transistor Qb is operated. After a counting value Nb is measured by counting the clock at that time, the offset current Ioffset is increased or decreased to make the counting value Nb amount to Ncref, and the measured value of the increase or the decrease is set to a memory. From this, transistor variations between the MOS transistors Qa and Qb can be compensated.

(Step SS3) Next, the MOS transistor 82 is turned off by the control signal SW2, the MOS transistor Q81 is turned on by the control signal SW1, the MOS transistor Q72 is turned off by the select signal SEL12, and the MOS transistor Q73 is turned on by the select signal SEL13. Then, only the MOS transistor is operated. After a counting value Nc is measured by counting the clock at that time, the offset current Ioffset is increased or decreased to make the counting value Nc amount to Ncref, and the measured value of the increase or the decrease is set to a memory. From this, transistor variations between the MOS transistors Qa and Qc can be compensated.

(Step SS4) Next, the MOS transistors Q81 and Q82 are turned off by the control signals SW1 and SW2, respectively.

(Step SS5) Next, only the MOS transistor Qa is operated by the select signal SEL11, the counting value Ncref of the clock regarding the external reference voltage EVref is counted, only the MOS transistor Qc is operated by the select signal SEL13, the Ioffset that compensates variations between Qa and Qc is set, the counting value Ncc of the clock regarding the internal voltage Vin is counted, and the internal voltage trimming process in FIG. 3 is performed.

(Step SS6) Next, only the MOS transistor Qa is operated by the select signal SEL11, the counting value Ncref of the clock regarding the external reference voltage EVref is counted, only the MOS transistor Qb is operated by the select signal SEL12, the Ioffset that compensates variations between Qa and Qb is set, the counting value Ncc of the clock regarding the high voltage VPP is counted, and the internal voltage trimming process in FIG. 3 is performed.

In the fourth embodiment described above, the MOS transistor Q1, which is taken as the input switch element, is omitted. The external reference voltage EVref input from the test device through the multipad MP, the internal voltage Vin from the switch circuit 33 and the high voltage VPP (VPP>VN) from the pump circuit 31-N are received by the MOS transistors Qa, Qb and Qc, respectively. Then, variations of the MOS transistors Qa, Qb and Qc are compensated. From this, in contrast to prior arts, since the internal voltage Vin and the high voltage VPP (such as 30V) are measured by respective circuits, respectively, there is a special feature that the high voltage VPP can be measured more accurately.

In the fourth embodiment described above, in steps SS2 and SS3, the offset current Ioffset is increased or decreased to make the clock counting value amount to Ncref, and the measured value of the increase or the decrease is set to a memory, and thus transistor variations between the MOS transistors Qa and Qb or between the MOS transistors Qa and Qc are compensated. However, the invention is not limited thereto. As in steps SS2 and SS3, the increased value or decreased value of the offset current Ioffset is memorized, and then the offset current Ioffset is set to the same value for the three trimming process cases described above. And, the compensation is performed by using the clock frequency or the clock counting value equivalent to the increased/decreased value of the offset current Ioffset to compensate transistor variations between the MOS transistors Qa and Qb or between the MOS transistors Qa and Qc.

In the fourth embodiment described above, the high voltage VPP and a circuit of the BIST circuit 3C, which is connected to the high voltage VPP, may be removed.

Fifth Embodiment

Figure 8:
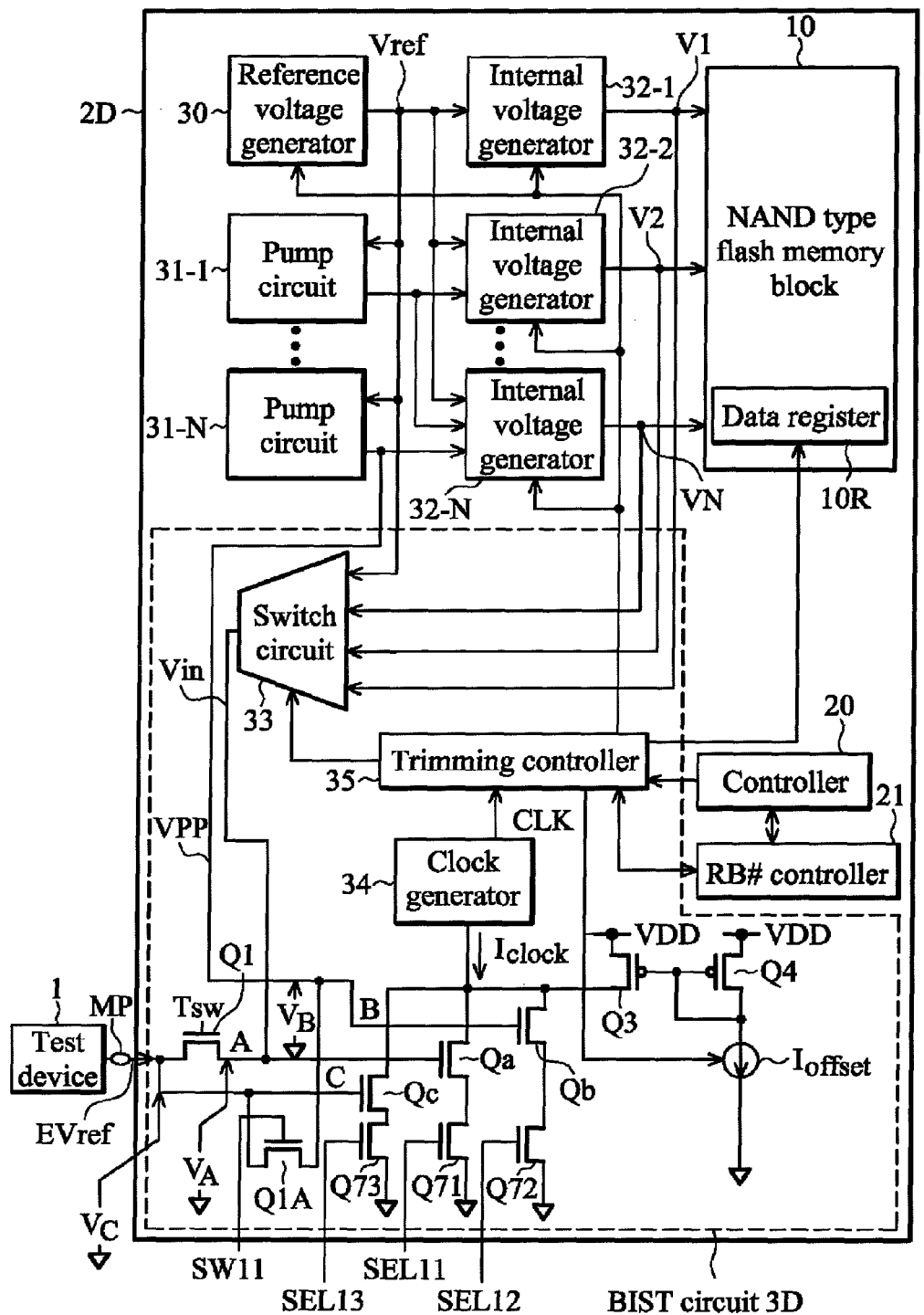
FIG. 8 is a block diagram of a NAND-type flash memory 2D according to the fifth embodiment of the invention.
Figure 9:
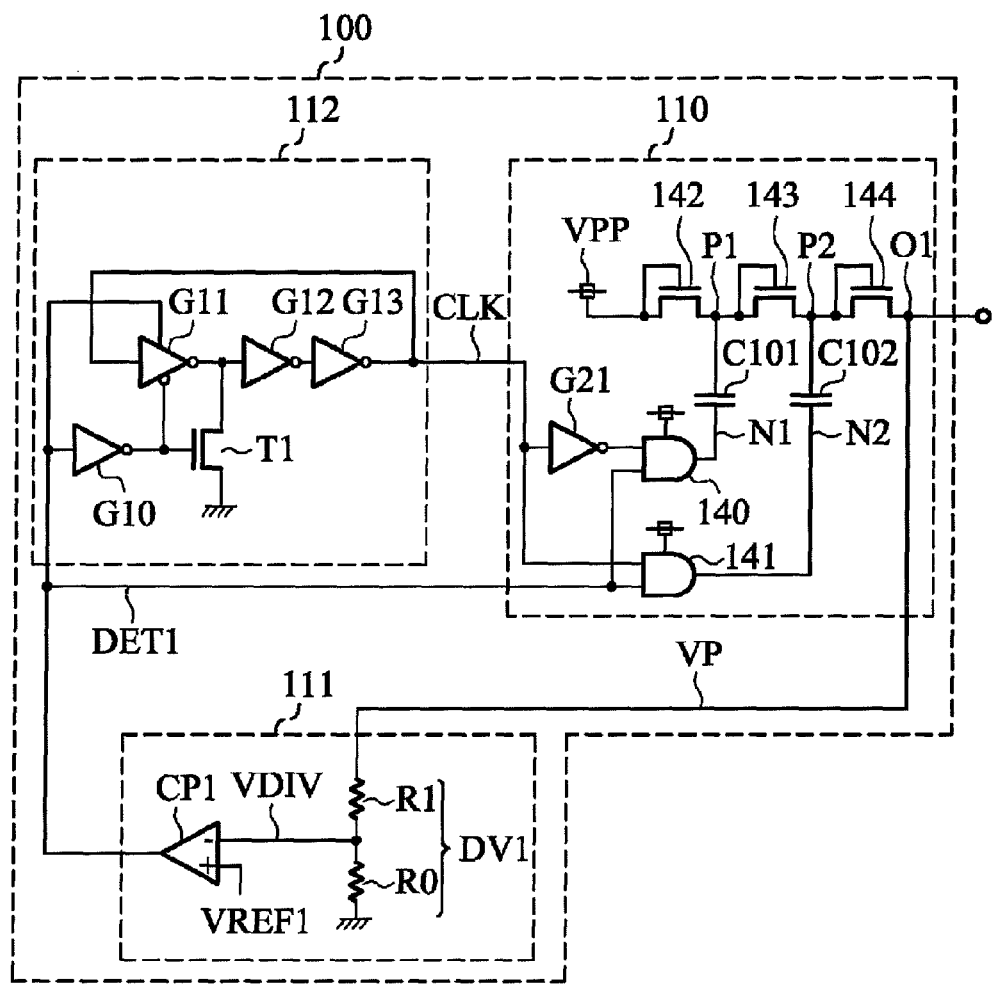
FIG. 9 is a circuit diagram of a charge pump circuit 100 used in a flash memory according to the first prior art.
Figure 10:
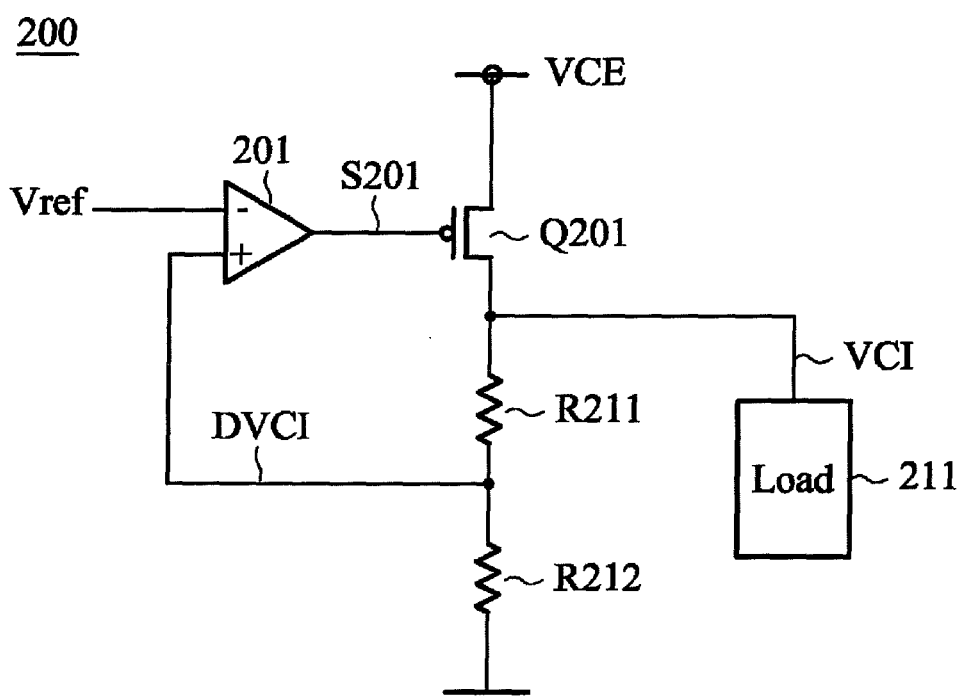
FIG. 10 is a circuit diagram of an internal voltage supplying circuit 200 according to the second prior art.

FIG. 8 is a block diagram of a NAND-type flash memory 2D according to the fifth embodiment of the invention. The NAND-type flash memory 2D according to the fifth embodiment comprises a BIST circuit 3D, having the same effects as the BIST circuit 3C of the fourth embodiment. The BIST circuit 3D is compared with the BIST circuit 3C in FIG. 7 as following:

(1) Instead of the MOS transistors Q81 and Q82, the MOS transistor Q1 regarding the first embodiment and a MOS transistor Q1A controlled by the selective signal SEL11 are included in the BIST circuit 3D.

In the embodiment, for using the MOS transistor Q1 (switch element) regarding the first embodiment, the MOS transistor Q1A (switch element) is included instead of the MOS transistors Q81 and Q82. Thus, the effects which are the same as that in the fourth embodiment are realized. In FIG. 8, the external reference voltage EVref from the test device 1 is applied to the node B through the multipad MP and the MOS transistor Q1A.

In the BIST circuit 3D as described above, the external reference voltage EVref input from the test device 1 through the multipad MP, the internal voltage Vin from the switch circuit 33 and the high voltage VPP from the pump circuit 31-N are received by the MOS transistors Qa, Qb and Qc, respectively. Then, the MOS transistors Q1 and Q1A, switch elements for compensating effects of transistor variations between the MOS transistors Qb and Qc measured in advance, are prepared. The embodiment is a combination of the first and the fourth embodiment:

(1) As in the first embodiment, the comparison between the external reference voltage EVref and the internal voltage Vin is performed by the MOS transistor Qa.

(2) As in the fourth embodiment, the comparison between the external reference voltage EVref and the high voltage VPP is performed by the MOS transistors Qb and Qc.

(Step SS11) Firstly, the switch circuit 33 is turned off, and the external reference voltage EVref corresponding to the internal voltage Vin is applied to the multipad MP. The offset current Ioffset is set to a predetermined initial value. The MOS transistor Q1 is turned on by the control signal Tsw, the MOS transistor Q1A is turned off by the control signal SW11, and the MOS transistor Q71 is turned on by the select signal SEL11. Then, only the MOS transistor Qa is operated, the clock at that time is counted, and the counting value is adjusted to match Ncref by adjusting Ioffset. The sequence described above is similar to the steps S11~S15 of FIG. 3.

(Step SS12) Next, the trimming process of the internal voltage Vin is performed. The MOS transistor Q1 is turned off by the control signal Tsw. The switch circuit 33 is turned on to output the internal voltage Vin, and the internal voltage is applied to the node A. The transistor Q71 is turned on by the select signal SEL11. Thus, only the MOS transistor Qa is operated. After a counting value Na is measured by counting the clock at that time, Vin is adjusted by changing the trimming code of the corresponding internal voltage to make the counting value Na become Ncref. When Na=Ncref is realized, the trimming ends. The sequence described above is similar to parts of the sequence of steps S1~S8~END of FIG. 3. The process of the steps SS11 and SS12 described above is equal to the first embodiment.

(Step SS13) Next, the process proceeds to the trimming of the high voltage VPP output from the pump circuit 31-N. Since the MOS transistors are used in the trimming of the high voltage VPP, transistor variations between the two MOS transistors are compensated first. In the embodiment, the high voltage VPP will be explained in the case where the high voltage VPP cannot pass through the MOS transistor (such as Q1 and Q1A in FIG. 8) without having a voltage drop because VPP is the highest voltage among the internal voltages. When the gate voltage is the high voltage VPP and the drain voltage is the high voltage VPP, the voltage that can be output from the source voltage is VPPI (VPPI<VPP, for example, VPPI is smaller than VPP for at least a predetermined threshold voltage).

When the pump circuit 31-N is turned off and the external reference voltage VrefPI corresponding to the high voltage VPPI is applied to the multipad MP, the offset current Ioffset is set to the predetermined initial value, the MOS transistor Q1 is turned off by the control signal Tsw, the MOS transistor Q1A is turned off by the control signal SW11, the MOS transistors Q71 and Q72 are turned off by the select signals SEL11 and SEL12, and the MOS transistor Q73 is turned on by the select signal SEL13. Then, only the MOS transistor Qc is operated. After a counting value Nc is measured by counting the clock at that time, the offset current Ioffset is increased or decreased to make the counting value Nc amount to Ncref, and the measured value of the increase or the decrease is set to a memory. The sequence described above is regarding Qc and is similar to the steps S11 S15 of FIG. 3. Here, the reference value Ncref may be different from that in the steps SS11 and SS12.

(Step SS14) Next, the MOS transistor Q1A is turned on by the control signal SW11, the MOS transistors Q71 and Q73 are turned off by the select signals SEL11 and SEL 13, and the MOS transistor Q72 is turned on by the select signal SEL12. Then, only the MOS transistor Qb is operated. After a counting value Nb is measured by counting the clock at that time, the offset current Ioffset is increased or decreased to make the counting value Nb amount to Ncref, and the measured value of the increase or the decrease is set to a memory. The sequence described above is regarding Qb and is similar to the steps S11~S15 of FIG. 3. From this, transistor variations between the MOS transistors Qb and Qc can be compensated.

(Step SS15) Next, the trimming process of the high voltage VPP is performed. The MOS transistor Q1A is turned off by the control signal SW11, the external reference voltage EVrefP corresponding to the original high voltage VPP is applied to the multipad MP, the offset current Ioffset obtained corresponding to Qc in the step SS13 is set, the MOS transistors Q71 and Q72 are turned off by the select signals SEL11 and SEL12, and the MOS transistor Q73 is turned on by the select signal SEL13. Then, only the MOS transistor Qc is operated, and a counting value NcP is measured by counting the clock at that time.

(Step SS16) The MOS transistor Q1A is turned off by the control signal SW11, the pump circuit is turned on, and the high voltage VPP is applied to the node B. The offset current Ioffset obtained corresponding to Qb in the step SS14 is set, the MOS transistor Q72 is turned on by the select signal SEL12, and the MOS transistors Q71 and Q73 are turned off by the select signals SEL11 and SEL13. Then, only the MOS transistor Qb is operated. After the counting value Nb is measured by counting the clock at that time, the high voltage VPP is adjusted by changing the trimming code of the corresponding high voltage to make the counting value Nb amount to the counting value NcP obtained in step SS15. When Nb=NcP is realized, the trimming ends, and thus, the high voltage VPP is set to be the external reference voltage EVref equal to the target voltage.

Though the compensation is performed at one point of the voltage VPPI which is lower than the high voltage VPP in the steps SS15 and SS16, the offset current can be compensated more precisely by measuring multiple points of the voltage VPPI and using the linear-extrapolation method, or the counting value NcP compensation can also be applied in similar way. Moreover, the order of the process of the step SS14 and the process of the step SS15 may be exchanged.

In the fifth embodiment described above, after the process which is the same as the first embodiment is performed, the external reference voltages EVrefPI and EVrefP input from the test device 1 through the multipad MP, the internal voltage Vin from the switch circuit 33 and the high voltage VPP from the pump circuit 31-N are received by the MOS transistors Qa, Qb and Qc, respectively. Then, transistor variations between the MOS transistors Qb and Qc can be compensated. In view of this, in contrast to the prior arts, since the internal voltage Vin and the high voltage VPP (such as 30V) are measured by respective circuits, the high voltage VPP can be measured accurately.

Moreover, in the process of the fifth embodiment, the later part (SS13~SS16) after the process (SS11~SS12) which is the same as the first embodiment can be applied to the fourth embodiment.

In the fifth embodiment described above, in the steps SS13 and SS14, the offset current is increased or decreased to make the counting value account to the predetermined reference value Ncref, and the measured value of the increase or the decrease is memorized, and therefore transistor variations between the MOS transistors Qb and Qc are compensated. However, the invention is not limited thereto. As in steps SS13 and SS14, the increased value or decreased value of the offset current Ioffset is memorized, the offset current Ioffset is set as in the two cases described above, and thus, transistor variations between the MOS transistors Qb and Qc are compensated by changing the clock frequency or the clock counting value equivalent to the increased/reduced value of the offset current Ioffset.

In the fifth embodiment described above, the high voltage VPP and a circuit of the BIST circuit 3D, which is connected to the high voltage VPP may be removed.

Modified Embodiment

In the embodiments described above, the NAND-type flash memory is used to describe the embodiment and the invention is not limited thereto. The embodiments can be applied to a semiconductor circuit device having a NOR type flash memory, a DRAM or any other semiconductor memory device.

In the embodiments described above, though the external reference voltage EVref from the test device 1 is used as the reference voltage, the invention is not limited thereto. A predetermined reference voltage generated inside the semiconductor circuit device such as the memory chip may be used.

In the embodiments described above, though the plurality of internal voltages V1~VN are generated, the invention is not limited thereto. At least one internal voltage may be generated.

Difference with the Third Prior Art

Figure 11:
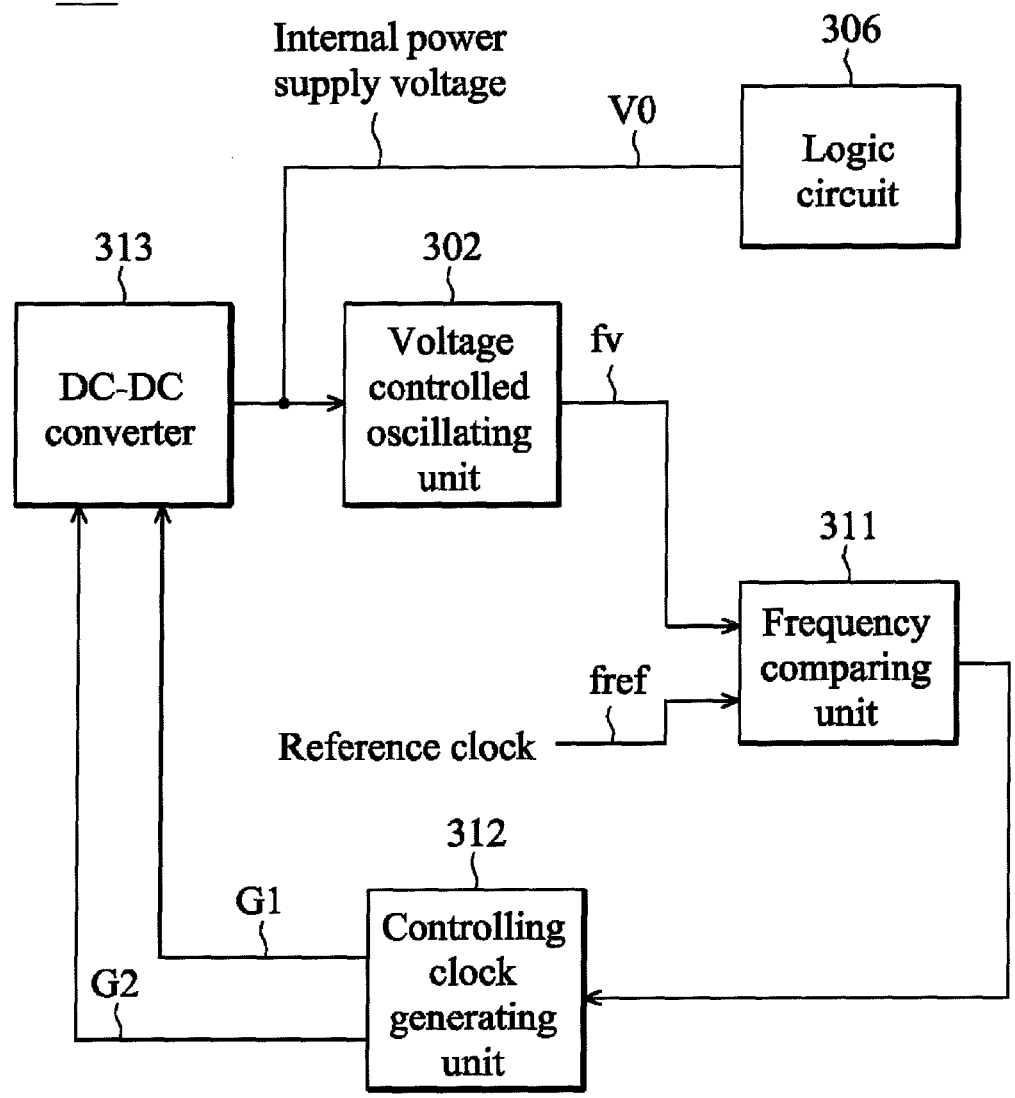
FIG. 11 is a circuit diagram of an internal voltage generator 300 according to the third prior art.
Figure 12:
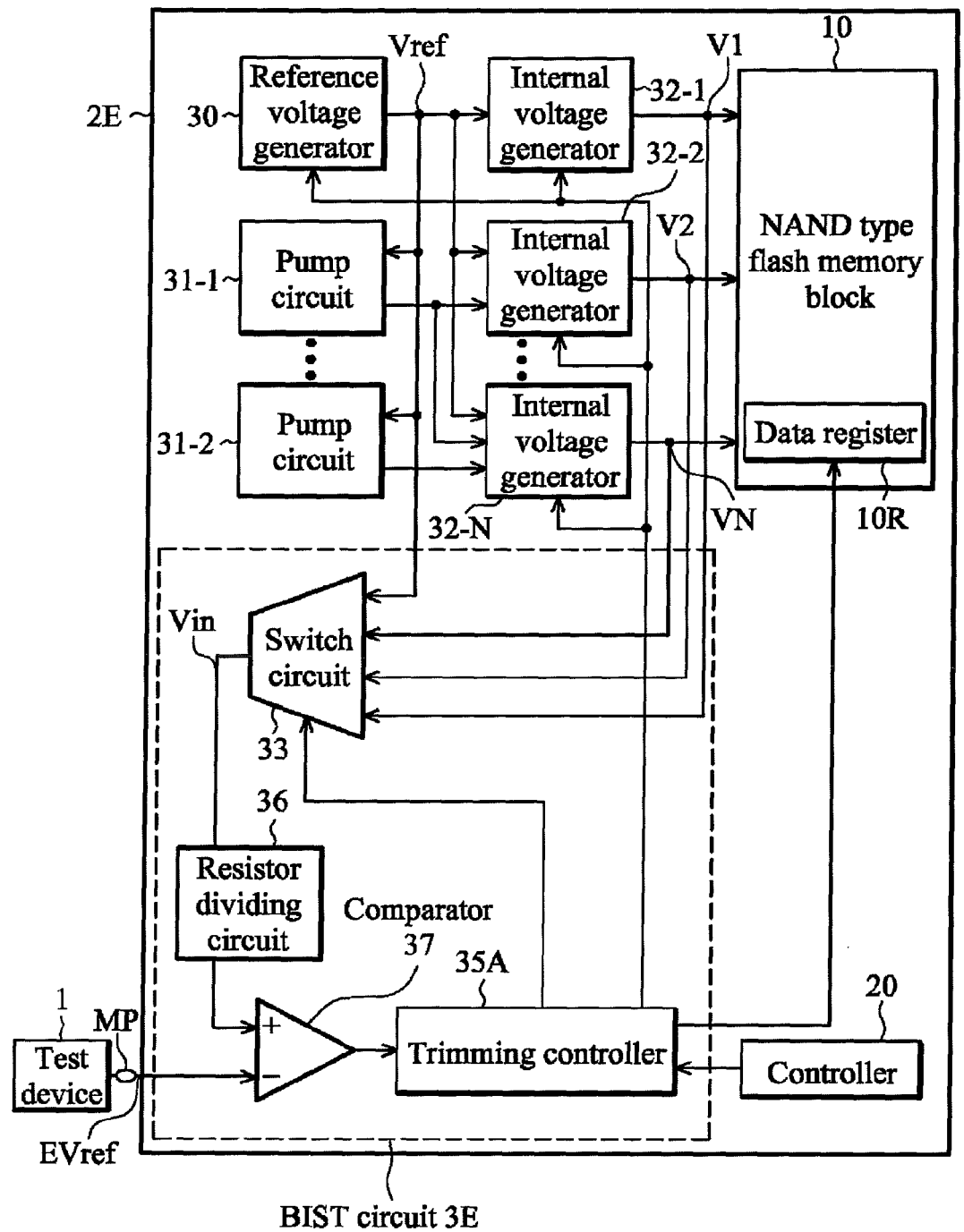
FIG. 12 is a block diagram of a NAND-type flash memory 2E according to the fourth prior art.

In the internal voltage generating circuit 300 according to the third prior art of FIG. 11, the internal power supply voltage V0 is controlled according to the frequency fref of the reference clock, and the voltage controlled oscillating unit 302 is used, as in the circuits regarding the embodiments of the invention. However, in the circuits regarding the embodiments of the invention, the difference is that the internal power supply voltage V0 is not directly controlled. In this case, the reference clock frequency fref is more important than the internal power supply voltage V0. The frequency fv is set to coincide with the frequency fref by using the ring oscillator of FIG. 2, and thus the internal power supply voltage V0 is controlled accordingly. Therefore, the logic circuit taking the internal power supply voltage V0 as the power source may be operated at the frequency fref.

Possibility For Industrial Application

As described above, the invention provides an internal voltage trimming circuit having a simple configuration and a method thereof. The internal voltage trimming circuit and the method according to the invention don't use the resistor dividing circuit and the comparator, and thus the internal voltage trimming circuit and the method may be operated by a consumption current which is smaller than that of prior arts.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An internal voltage trimming circuit, comprising:
a control means, trimming an internal voltage by using a change in a counting value of a clock, wherein the internal voltage is generated by an internal voltage generator of a semiconductor device, and the clock is generated by a clock generator according to current flowing through a transistor of a power supply current source for the clock generator,
wherein the control means counts a first counting value of the clock generated by the clock generator when a predetermined reference voltage is applied to a control terminal of the transistor and a second counting value of the clock generated by the clock generator when the internal voltage is applied to the control terminal of the transistor, and the control means controls the internal voltage generated by the internal voltage generator to make the second counting value substantially coincide with the first counting value.

2. The internal voltage trimming circuit as claimed in claim 1, further comprising:
a current source, generating an offset current to be added for the current flowing through the transistor of the power supply current source,
wherein the control means controls the offset current to make the first counting value of the clock generated by the clock generator when the predetermined reference voltage is applied to the control terminal of the transistor be a predetermined value.

3. The internal voltage trimming circuit as claimed in claim 1, further comprising:
a voltage dividing circuit, dividing the internal voltage into a predetermined voltage through capacitive division or resistive division and applying the divided voltage to the control terminal of the transistor.

4. The internal voltage trimming circuit as claimed in claim 2, further comprising:
a voltage dividing circuit, dividing the internal voltage into a predetermined voltage through capacitive division or resistive division and applying the divided voltage to the control terminal of the transistor.

5. The internal voltage trimming circuit as claimed in claim 1, further comprising:
a plurality of transistors of the power supply current source for the clock generator; and
a selecting means, selectively operating one of the plurality of transistors,
wherein the control means applies a plurality of internal voltages to control terminals of the plurality of transistors and trims the plurality of internal voltages by sequentially and selectively operating the plurality of transistor through the selecting means.

6. The internal voltage trimming circuit as claimed in claim 2, further comprising:
a plurality of transistors of the power supply current source for the clock generator; and
a selecting means, selectively operating one of the plurality of transistors,
wherein the control means applies a plurality of internal voltages to control terminals of the plurality of transistors and trims the plurality of internal voltages by sequentially and selectively operating the plurality of transistor through the selecting means.

7. The internal voltage trimming circuit as claimed in claim 3, further comprising:
a plurality of transistors of the power supply current source for the clock generator; and
a selecting means, selectively operating one of the plurality of transistors,
wherein the control means applies a plurality of internal voltages to control terminals of the plurality of transistors and trims the plurality of internal voltages by sequentially and selectively operating the plurality of transistor through the selecting means.

8. The internal voltage trimming circuit as claimed in claim 4, further comprising:
a plurality of transistors of the power supply current source for the clock generator; and
a selecting means, selectively operating one of the plurality of transistors,
wherein the control means applies a plurality of internal voltages to control terminals of the plurality of transistors and trims the plurality of internal voltages by sequentially and selectively operating the plurality of transistor through the selecting means.

9. The internal voltage trimming circuit as claimed in claim 5, wherein the plurality of transistors comprises a first and a second transistor, the reference voltage is applied to a control terminal of the first transistor, the reference voltage is applied to a control terminal of the second transistor via a switch element, and the internal voltage is applied to the control terminal of the second transistor.

10. The internal voltage trimming circuit as claimed in claim 5, wherein the plurality of transistors comprises a first, a second and a third transistor, the reference voltage is applied to a control terminal of the first transistor, the reference voltage is applied to a control terminal of the second transistor via a first switch element, the reference voltage is applied to a control terminal of the third transistor via a second switch element, the internal voltage is applied to the control terminal of the second transistor, and a high voltage having an internal voltage higher than the internal voltage is applied to the control terminal of the third transistor.

11. The internal voltage trimming circuit as claimed in claim 1, further comprising:
a plurality of transistors of the power supply current source for the clock generator;
a selecting means, selectively operating one of the plurality of transistors; and
a current source, generating an offset current to be added for the current flowing through the transistor of the power supply current source,
wherein each of the reference voltage and at least one internal voltage is applied to a control terminal of a corresponding one of the plurality of transistors,
wherein after variations among the plurality of transistors are compensated, the control means selectively operates the plurality of transistor through the selecting means, applies each of the reference voltage and the at least one internal voltage to a control terminal of a corresponding one of the plurality of transistors sequentially, and trims the at least one internal voltage, and
wherein the variations among the plurality of transistors are compensated by applying a predetermined same voltage to the control terminals of the plurality of transistors, sequentially and selectively operating the plurality of transistor through the selecting means, and controlling the offset current to make a plurality of counting values of the clock generated by the clock generator be the same with each other.

12. The internal voltage trimming circuit as claimed in claim 11, wherein the plurality of transistors comprises a first transistor, the reference voltage is applied to a control terminal of the first transistor via a switch element, and the internal voltage is applied to the control terminal of the first transistor.

13. The internal voltage trimming circuit as claimed in claim 5, wherein the plurality of transistors comprises a first and a second transistor, the reference voltage is applied to a control terminal of the first transistor, the reference voltage is applied to a control terminal of the second transistor via a switch element, and the internal voltage is applied to the control terminal of the second transistor.

14. The internal voltage trimming circuit as claimed in claim 5, wherein the plurality of transistors comprises a first, a second and a third transistor, the reference voltage is applied to a control terminal of the first transistor, the reference voltage is applied to a control terminal of the second transistor via a first switch element, the reference voltage is applied to a control terminal of the third transistor via a second switch element, the internal voltage is applied to the control terminal of the second transistor, and a high voltage having an internal voltage higher than the internal voltage is applied to the control terminal of the third transistor.

15. A semiconductor device, comprising the internal voltage trimming circuit as claimed in claim 1.

16. An internal voltage trimming method for using a change in a counting value of a clock generated by a clock generator according to current flowing through a transistor of a power supply current source for the clock generator to trim an internal voltage generated by an internal voltage generator of a semiconductor circuit device, comprising:

a step of counting a first counting value of the clock generated by the clock generator when a predetermined reference voltage is applied to a control terminal of the transistor; and a step of counting a second counting value of the clock generated by the clock generator when the internal voltage is applied to the control terminal of the transistor and controlling the internal voltage generated by the internal voltage generator to make the second counting value substantially coincide with the first counting value.

17. The internal voltage trimming method as claimed in claim 16, further comprising:

a step of controlling an offset current of a current source generating the offset current which is added for the current flowing through the transistor of the power supply current source to make the first counting value of the clock generated by the clock generator when the reference voltage is applied to the control terminal of the transistor be a predetermined value.

* * * * *